(12) United States Patent
Liang

(10) Patent No.: US 9,590,774 B1
(45) Date of Patent: Mar. 7, 2017

(54) CIRCUIT FOR INTRODUCING SIGNAL JITTER

(71) Applicant: Microsoft Technology Licensing, LLC, Redmond, WA (US)

(72) Inventor: Darryl Robert Liang, Incline Village, NV (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/866,599

(22) Filed: Sep. 25, 2015

(51) Int. Cl.
*H04L 1/24* (2006.01)
*G01R 31/00* (2006.01)
*G01R 31/317* (2006.01)

(52) U.S. Cl.
CPC ............ *H04L 1/241* (2013.01); *G01R 31/002* (2013.01); *G01R 31/31709* (2013.01)

(58) Field of Classification Search
CPC .. H04L 1/241; G01R 31/002; G01R 31/31709
See application file for complete search history.

(56) References Cited

U.S. PATENT DOCUMENTS

| | | | |
|---|---|---|---|
| 7,509,608 B1 | 3/2009 | Duong | |
| 8,327,204 B2 | 12/2012 | Hafed et al. | |
| 8,400,197 B2 * | 3/2013 | Romano | H03L 7/07 327/156 |
| 8,407,535 B2 | 3/2013 | Whitby-Strevens | |
| 8,599,910 B2 | 12/2013 | Nagatani et al. | |
| 8,848,809 B2 | 9/2014 | Whitby-Strevens | |
| 8,982,999 B2 | 3/2015 | Bhagavathula et al. | |
| 9,244,485 B1 * | 1/2016 | Koh | G06F 1/08 |
| 2004/0223559 A1 * | 11/2004 | Hill | G01R 31/31709 375/306 |

(Continued)

OTHER PUBLICATIONS

Stephens, Ransom, "Deterministic Jitter for High Speed Serial Receiver Tolerance Testing", Published on: Mar. 8, 2012 Available at: http://www.edn.com/electronics-blogs/eye-on-standards/4378110/Deterministic-Jitter-for-High-Speed-Serial-Receiver-Tolerance-Testing.

(Continued)

*Primary Examiner* — Kenneth Lam
(74) *Attorney, Agent, or Firm* — Brandon Roper; Judy Yee; Micky Minhas

(57) ABSTRACT

A circuit that introduces a calibrated amount of jitter and/or amplitude variation into a signal. By generating a signal with some predetermined amount of variation, signal consuming equipment may be tested to verify that it can properly extract the information from the signal, despite the presence of such variation. The circuit includes a signal propagation channel through which a signal may propagate. However, to introduce signal variation, the signal propagation channel passes close to electromagnetic interference generation circuitry. A calibration circuit has one or multiple settings that sets on or more values of parameters of the electromagnetic interference generation circuitry. During calibration, the parameters are adjusted until desired variation is detected, and which point the calibrated values are set and associated with that signal variation. This may be repeated for multiple calibration values and multiple settings. The ability to handle signals of different variances may then be accomplished.

20 Claims, 3 Drawing Sheets

(56) References Cited

U.S. PATENT DOCUMENTS

| | | | |
|---|---|---|---|
| 2005/0044463 A1* | 2/2005 | Frisch | G01R 31/31709 714/738 |
| 2006/0067390 A1* | 3/2006 | Tek | G01R 29/26 375/224 |
| 2006/0123303 A1* | 6/2006 | Frame | G01R 31/31937 714/742 |
| 2006/0251200 A1 | 11/2006 | Miller | |
| 2006/0285584 A1 | 12/2006 | Baumgartner et al. | |
| 2006/0291547 A1* | 12/2006 | Hsu | G06F 13/4226 375/226 |
| 2008/0192814 A1 | 8/2008 | Hafed et al. | |
| 2008/0285636 A1* | 11/2008 | Sartschev | G01R 31/31709 375/224 |
| 2008/0304608 A1* | 12/2008 | Ishida | G01R 31/31709 375/371 |
| 2012/0025889 A1 | 2/2012 | Su | |
| 2012/0169361 A1* | 7/2012 | Chien | G01R 31/31716 324/750.3 |
| 2012/0189086 A1* | 7/2012 | Cai | G01R 31/31709 375/371 |
| 2013/0271124 A1* | 10/2013 | Kirkpatrick | G01R 33/07 324/251 |
| 2014/0133614 A1 | 5/2014 | Huntley et al. | |
| 2014/0167782 A1* | 6/2014 | Yeo | G01R 31/002 324/613 |

OTHER PUBLICATIONS

"PCI Express 3.0 Base Stressed Eye Calibration and Receiver Testing", Published on: Aug. 23, 2012 Available at: www.tek.com/dl/55W-28589-0.pdf.

"How to Test a MIPI M-PHY High-Speed Receiver", Published on: Aug. 10, 2014 Available at: http://cp.literature.agilent.com/litweb/pdf/5991-2848EN.pdf.

Eads, Rick, "PCI Express® Advanced Signaling Analysis", Published on: Dec. 24, 2010 Available at: https://www.pcisig.com/developers/main/training_materials/get_document?doc_id=283061267c24f0a89039cc0764c46a1a57514460.

* cited by examiner

CIRCUIT FOR INTRODUCING SIGNAL JITTER

BACKGROUND

Electronic devices have revolutionized the way human beings work, play, and communicate. In order for electronic devices to communicate, a device that receives the signal must be able to extract information from the received signal. Ideal signal communication channels exist in theory only. In the real world, when signals are transmitted over a communication channel, various types of distortion are introduced into the signal. In order for the receiving device to be able to use the received signal, the receiving device needs to be able to extract the useful information from the received signal despite the distortion.

There are various types of distortion that a signal can experience within a real world communication channel. One type is of course attenuation, where the strength of the channel becomes weaker due to loss in power with unit distance. The most extreme example of this is airwave broadcasts, where power is lost rapidly often at best as a function of the inverse of the square of the distance from transmission. However, even in optical fibers and electrical conductors, signal power attenuates through conversion into heat (i.e., through the creation of phonons). Another type of distortion is jitter in which the phase of the signal at the reception point moves slightly out of synchronization with its original phase of transmission, i.e. a given signal amplitude at the receiver occurs very slightly earlier or later in time than expected, relative to a particular time reference. Echoes may also be generated within the signal due to reflection of the signal. Cross-channel interference or distortion due to external electro-magnetic interference may also introduce noise into the signal.

While an electronic device may be able to extract information from the signal perfectly even with some distortion, the error in the extracted information may increase as the distortion increases. Ultimately, if the distortion is significant enough, no helpful information may be extracted from the received signal. In order to test the ability of the device to receive and extract sufficient information from a distorted signal in order to function properly, channels are constructed that simulate real-world channels. For instance, to emulate 5 kilometers of optical fiber, a roll of 5 miles of optical fiber is set up. However, setting up a channel to produce a signal with distortion is an expensive task.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

At least one embodiment described herein relates to a circuit that introduces a calibrated amount of jitter into a signal. By generating a signal with some predetermined amount of jitter in the signal, signal consuming equipment may be tested to verify that the equipment can properly extract the information from the signal, despite the presence of a specified maximum quantity of such jitter. Thus, the signal consuming equipment can be tested to verify tolerance when receiving signals that have gone through a channel that introduces jitter, as all channels do.

The circuit includes a signal propagation channel through which a signal may propagate. However, to introduce jitter, the signal propagation channel passes close to electromagnetic interference generation circuitry. A calibration circuit is able to have one or multiple settings that set one or more values of parameters of the electromagnetic interference generation circuitry. During calibration, the parameters are adjusted until a desired amount of jitter is detected, at which point the calibrated values are set and associated with that amount of jitter. This may be repeated for multiple calibration values and multiple jitter settings. Later, when testing a signal, predetermined amounts of jitter are introduced into the signal by having the calibration circuit use the associated settings to set appropriate values of the electromagnetic interference circuitry.

In some embodiments, rather than, or in addition to, adjusting the calibrated values to introduce jitter, variances in amplitude of the signal are likewise adjusted and associated with calibrated values of the electromagnetic interference generation circuitry. Thus signals of complex degradation that emulate signals passing through real-life channels may be generated. This thus allows signal consumption devices to be tested to verify their ability to operate correctly under real life conditions up to desired worst-case conditions. Furthermore, this is enabled via the use of a single circuit.

This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which.

DETAILED DESCRIPTION

At least one embodiment described herein relates to a circuit that introduces a calibrated amount of jitter into a signal. By generating a signal with some predetermined amount of jitter in the signal, signal consuming equipment may be tested to verify that the equipment can properly extract the information from the signal, despite the presence of a specified maximum quantity of such jitter. Thus, the signal consuming equipment can be tested to verify tolerance when receiving signals that have gone through a channel that introduces jitter, as all channels do.

The circuit includes a signal propagation channel through which a signal may propagate. However, to introduce jitter, the signal propagation channel passes close to electromagnetic interference generation circuitry. A calibration circuit is able to have one or multiple settings that set one or more values of parameters of the electromagnetic interference generation circuitry. During calibration, the parameters are adjusted until a desired amount of jitter is detected, at which point the calibrated values are set and associated with that amount of jitter up to desired worst-case conditions. This may be repeated for multiple calibration values and multiple jitter settings. Later, when testing a signal, predetermined amounts of jitter are introduced into the signal by having the calibration circuit use the associated settings to set appropriate values of the electromagnetic interference circuitry.

In some embodiments, rather than, or in addition to, adjusting the calibrated values to introduce jitter, variances in amplitude of the signal are likewise adjusted and associated with calibrated values of the electromagnetic interference circuitry. Thus signals of complex degradation that emulate signals passing through real-life channels may be generated. This thus allows signal consumption devices to be tested to verify their ability to operate correctly under real life conditions. Furthermore, this is enabled via the use of a single circuit. That said, while this single circuit may itself be an integrated circuit, the single circuit might instead consist of multiple circuits (such as integrated circuits, printed circuit boards, discrete components, and so forth).

Figure 1:
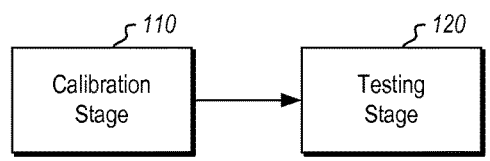
FIG. 1 generally illustrates two stages of operation of the principles described herein including a calibration phase and a testing phase.

FIG. 1 generally illustrates two stages of operation of the principles described herein. A first stage is a calibration stage 110 in which multiple calibration settings of a calibration circuit are each associated with a particular amount of jitter introduced into the signal. Alternatively, each calibration setting may be associated with both a jitter and amplitude variation (or more generally any kind of distortion, singly or in combination). In any case, the calibration settings are associated with a particular type of signal distortion, so that the signal with that distortion may be later generated.

A second stage is a testing stage 120 in which a signal of a desired distortion is generated by a circuit in order to test the ability of a signal receiver to receive the signal, despite the presence of the distortion. That way, prior to exposing the signal receiver to a real-world communication channel that introduces a similar distortion; the ability of the signal receiver to operate with signals received over the real-world communication channel may be verified.

Figure 2:
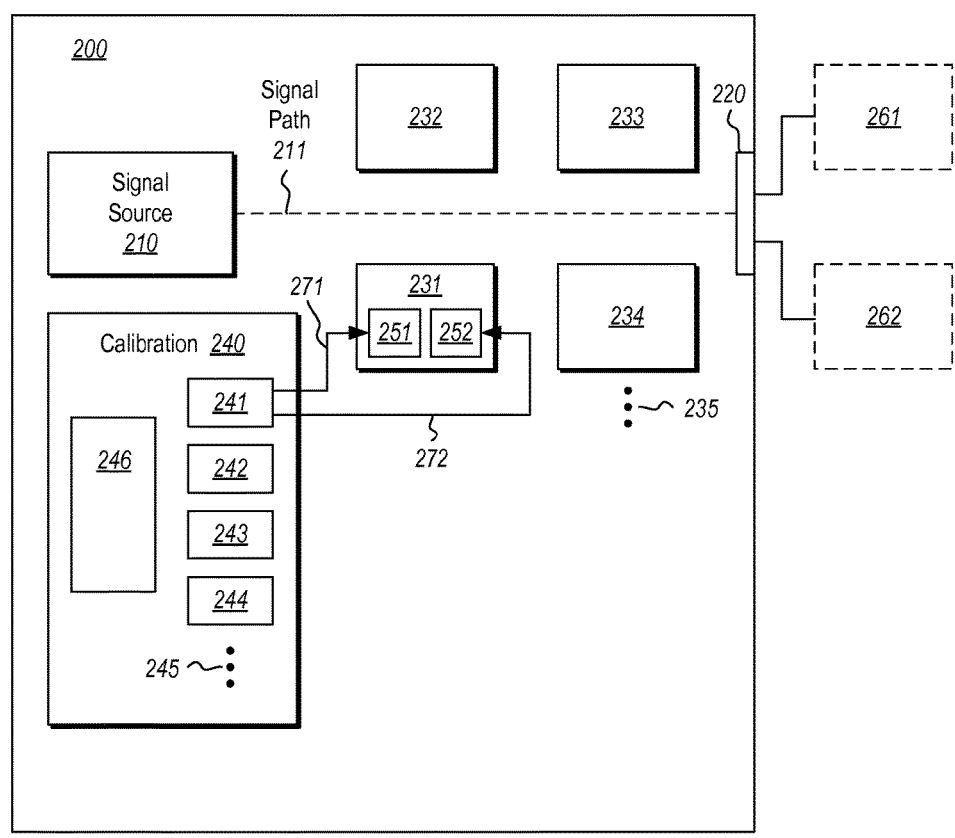
FIG. 2 symbolically illustrates a circuit in accordance with the principles described herein that may interact with a distortion measurement device during the calibration stage of FIG. 1, and with a device under test during the testing stage of FIG. 1.

FIG. 2 symbolically illustrates a circuit 200 in accordance with the principles described herein. While FIG. 2 is general, a more specific example circuit will be described below with respect to FIG. 4. While the circuit 200 may be an integrated circuit, it might also be a collection of circuits (such as integrated circuits, printed circuit boards, discrete components, and so forth). Where the circuit 200 is illustrated as including various components, that is not to say that the components are necessarily separate physical components or otherwise not integrated with one or more other components within the circuit 200. Furthermore, a single component may itself be embodied by multiple integrated circuits and/or discrete components. Accordingly, the components within the circuit 200 should be viewed more as functional entities rather than defining any physical boundaries of any particular type.

The integrated circuit 200 includes a signal source 210 and an output port 220. The signal source 210 may be an internal source that actually generates a signal, or perhaps may be an input port that simply receives a signal propagated from a prior channel. The principles described herein are not limited to the type of signal generated by the signal source 210, nor the nature of the information embodied on that signal. As an example, the signal generated at the signal source may an analog signal or a digital signal. The principles described herein are not limited to the encoding or modulation methodology in which information is represented within the signal. The principles described herein are also not limited to the type of information embodied within the signal. As an example, the signal may be a multi-media signal comprising video, audio, tactile, holographic, or any other sensory data, or combinations thereof. The signal may also constitute any form of data even that which is not multi-media data, such as computer-executable instructions, or raw data.

Furthermore, there is a signal propagation channel 211 (represented by the dashed line) between the signal source 210 and the output port 220. A signal generated by the signal source 210 may propagate through the signal propagation channel 211 to the output portion 220. However, the circuit 200 also includes electromagnetic interferences generation circuitry. For instance, in FIG. 2, there are four electromagnetic interference generation circuits 231, 232, 233 and 234 illustrated, which will also be collectively referred to herein as electromagnetic generation circuitry 230. That said, as represented by the ellipses 235, the principles described herein are not limited to the number of electromagnetic interference generation circuits. The circuit 200 may contain any number of electromagnetic generation circuits, even as few as one, to innumerable.

Each of the electromagnetic interference generation circuitry 230 has a one or more parameters that may be set by a calibration circuit 240. For instance, electromagnetic interference generation circuit 231 includes parameters 251 and 252 that may be adjusted by the calibration circuit 240 to adjust the nature and strength of electromagnetic interference emitted by the electromagnetic interference generation circuit 231, and which would as a result cause a particular amount of distortion (e.g., jitter or amplitude fluctuations) within a signal of a particular type traveling through the signal propagation channel 211. For instance, the same settings of the parameters 251 and 252 may result in different types of distortion depending on the nature of the signal itself (e.g., the encoding mechanism, the data-rate, the signal symbol constellation, signal power, and so forth).

During the first stage (calibration stage 110), a distortion measurement device 261 is coupled to the output port 220 to measure distortions introduced into the signal passing through the signal propagation channel 221 as a result of electromagnetic interference emitted by the signal generation circuit 231. When a possible distortion that could be helpful for future testing is detected, the values of the parameters 251 and 252 are recorded within the calibration circuit 240, and those values are associated with the desired distortion. This may be repeated multiple times for different types of distortion and different types of signals. Accordingly, the calibration circuit 240 is illustrated as including a plurality of calibration settings 241, 242, 243, 244 associated with four different distortion/signal type combinations. The ellipses 245 represents that there may be many more calibration settings.

Thus, given the signal type, and the desired distortion, calibration logic 246 operable on the calibration circuit 240 can determine the appropriate settings 241 through 245 for the parameters 251 and 252 of the electromagnetic interference generation circuitry 231. For instance, line 271 represents the calibration settings 241 setting a value of the parameter 251, and line 272 represents the calibration settings 241 setting a value of the parameter 252. The same mechanism may be used to calibrate parameters (not shown) for any of the other electromagnetic interference circuitry 230 as well. In fact, combinations of settings for multiple electromagnetic interference circuitry 230 may best generate a desired distortion in the signal. Thus, a given calibration setting for a particular signal and distortion may involve parameter settings for multiple of the electromagnetic distortion generation circuits 230.

Figure 3:
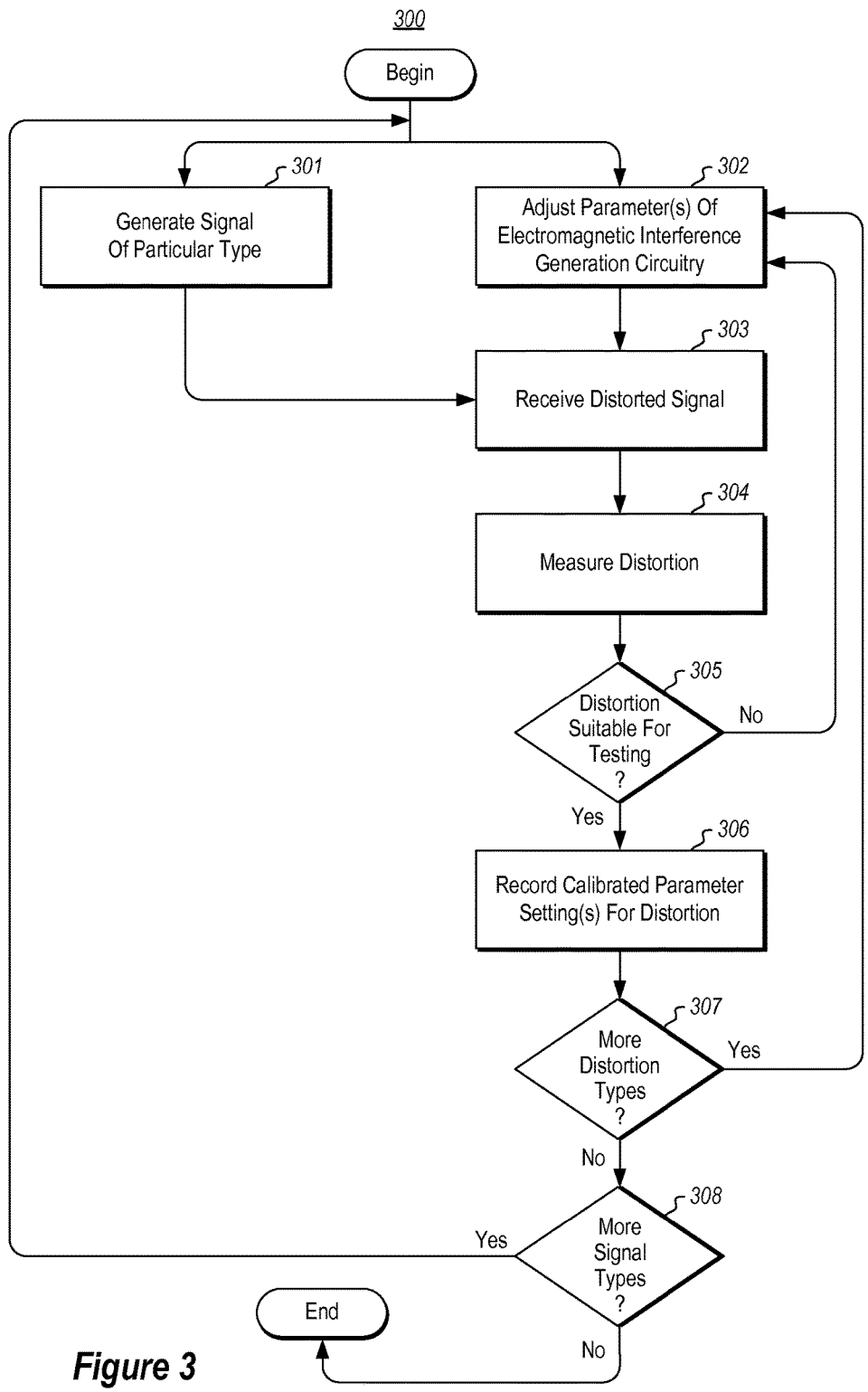
FIG. 3 illustrates a flowchart of a method for calibrating signal distortion in accordance with the principles described herein.

FIG. 3 illustrates a flowchart of a method 300 for calibrating signal distortion in accordance with the principles described herein. A signal of a particular type is generated and propagated through the signal propagation path (act 301). For instance, referring to FIG. 2, a signal is generated by the signal source 210, and passed through the signal propagation channel 211 towards the output port 220.

Also, one or more parameters of one or more close-by electromagnetic interference generation circuitry are adjusted (act 302). For instance, referring to FIG. 2, the calibration circuit 240 might sets values of parameters 251 and 252 of the electromagnetic interference generation circuit 231 (as represented by respective arrows 271 and 272).

The signal that has distortion resulting from the electromagnetic interference is then received (act 303). For instance, referring to FIG. 2, the distortion measurement device 261 receives the distorted signal from the output portion 220. The distortion of the signal is then measured (act 304). For instance, in FIG. 2, the distortion measurement device 261 measures the distortion of the distorted signal. In one embodiment, the distortion measurement device 261 may be an oscilloscope.

If the measured distortion is not of a suitable type for testing of the signal ("No" in decision block 305), the processing returns to act 302, where the same or different parameters are adjusted (act 302), and the process of acts 303 and 304 are repeated. If the measured distortion at some point is of a suitable type for testing of the signal ("Yes" in decision block 305), then the parameter settings are recorded by the calibration circuit and associated with the distortion and signal type (act 306). For instance, in FIG. 2, the calibration settings 241 may be recorded within the calibration circuit 240

If further distortions types are desired to be tested for this particular signal type ("Yes" in decision block 307), then processing returns to further adjust these or different parameter values of one or more of the electromagnetic interference generation circuitry 230 (act 302). The processing previously described is repeated until sufficient distortion settings are obtained for the signal type ("No" in decision block 307). It is then determined whether additional signal types are to have calibrated distortions (decision block 308). If so ("Yes" in decision block 308), then the signal type is changed in act 301, and then the process previously described is repeated until sufficient distortion settings are obtained for that signal as well. Once all of the desired distortion settings are obtained for all of the desired signals ("No" in decision block 308), the calibration process ends.

The electromagnetic interference generation circuits are positioned proximate the signal propagation channel, perhaps even in violation of one or more layout design rules. Such layout design rules are typically to prevent electromagnetic interference for affecting signal quality. However, where electromagnetic interference is supposed to introduce distortion into the signal, some of those layout design rules can be safely ignored.

The type of electromagnetic interference generation circuit employed is not critical so long as it is capable of having its parameters adjusted so as to introduce a calibrated amount of distortion (e.g., jitter or amplitude variation) into the signal propagating through the signal propagation path.

As an example only, the electromagnetic interference generation circuit 231 may be a clock line in which the calibration circuit may adjust parameters of the clock line such as the characteristics of the clock signal, or the length of the active clock line that is proximate the signal propagation channel 211. As an example only, the electromagnetic interference generation circuit 232 may be an array of networked switches in which the calibration circuit may be configured to alter the configuration and timing of the switches in the plurality of networked switches in response to the calibration settings. As an example only, the electromagnetic interference generation circuit 233 may be a noisy path that is driven by a noisy signal, in which case the calibration circuit may be configured to alter the variances of the varying signal in response to the calibration settings. As an example only, the electromagnetic interference generation circuit 234 may be a noisy path that has designed anomalies, which might be a different length as compared to the signal propagation channel 211, which anomalies may result in a different characteristic impedance as compared to the signal propagation channel 231. Furthermore, the signal being driven through the signal propagation channel 211 may likewise be driven through the noisy path, and then recombined, resulting in the distortion.

Referring back to FIG. 1, once the calibration stage 110 has completed, the signal testing stage 120 can begin. In this testing stage, rather than the distortion measurement device 261, a device under test 262 is coupled to the output port 220 of the integrated circuit 220. The aim now is to apply a particular distortion (e.g., particular amount of jitter) to a signal propagating through a signal propagation channel in an integrated circuit. Then, the operation of the device under test 262 may be evaluated. For instance, functional operation may be evaluated to determine if the device under test still operates despite the signal received from the output port 220 having the designed amount of distortion. Alternatively or in addition, signal quality parameters (such as bit-error ratios) may be requested from the device under test 262, to determine if the device under test 262 is experiencing impairment in extracting information from the signal. From such testing, it can be verified that the device under test 262 will likely operate well when encountering signals received over real-life communication channels that introduce similar distortions.

Figure 4:
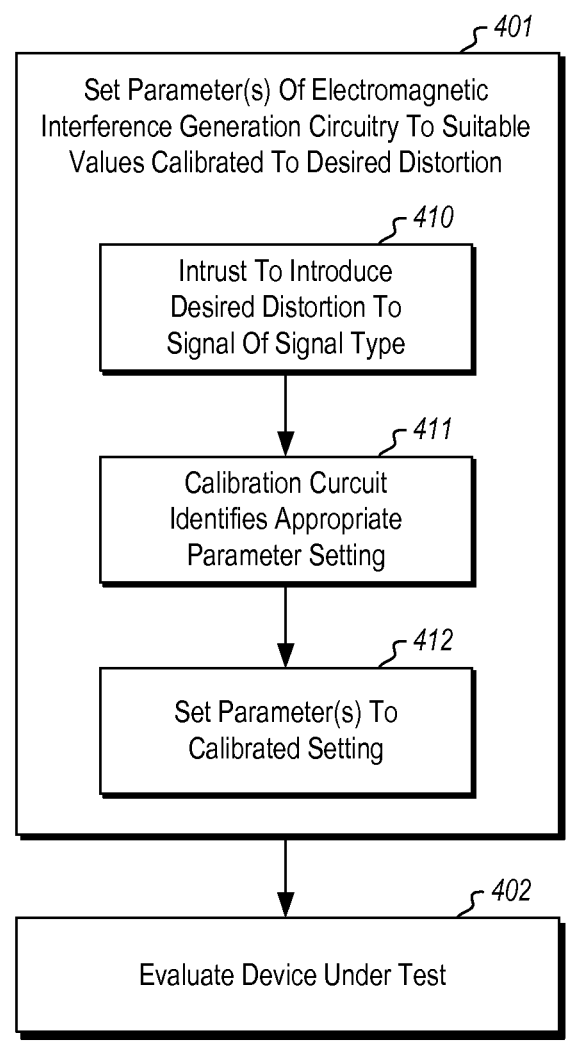
FIG. 4 illustrates a flowchart of a method for applying a particular amount of jitter to a signal propagating through a signal propagation channel in a circuit.

FIG. 4 illustrates a flowchart of a method 400 for applying a particular amount of jitter to a signal propagating through a signal propagation channel in a circuit. For instance, the method 400 may be performed in the circuit 200 of FIG. 2 when coupled to the device under test 262. Due to the prior calibration operation, testing is very efficient.

In particular, the calibration circuit is caused to set suitable value(s) of one or more parameters of an electromagnetic interference generation circuit that emits electromagnetic interference received at the signal propagating through signal propagation channel (act 401). For instance, the user might simply provide an instruction to the circuit 200, which is then passed to the calibration logic 245 of the calibration circuit, to set the values appropriate for a given distortion (e.g., the desired jitter) and signal type (e.g., the data rate) (act 410). The calibration circuit then identifies the appropriate calibration setting (act 411), and applies the settings to the parameters of the appropriate electromagnetic interference generation circuitry (act 412). Then, the device under test is evaluated for suitable operation (act 402).

Accordingly, the principles described herein provide a circuit that generates a signal of a calibrated amount of distortion (e.g., jitter) so that a device under test can be verified to function properly when receiving a signal of that calibrated amount of distortion. When that calibrated amount of distortion corresponds to the typical distortion introduced into signals received in real-world communication channels, the device under test can be verified as likely to function properly when receiving signals over such real-world communication channels, even without the device under test being in the field.

As used in this specification and claims, the terms "for example", "for instance", "like", and "such as," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

It is to be understood that the foregoing description is not a definition of the invention itself, but is a description of one or more example embodiments of the invention. The present invention may be embodied in other specific forms without departing from its spirit or essential characteristics. The invention is not limited to the particular embodiment(s) disclosed herein, but rather is defined solely by the claims below. The scope of the invention is, therefore, indicated by the appended claims rather than by the foregoing description. All changes which come within the meaning and range of equivalency of the claims are to be embraced within the scope.

The described embodiments are to be considered in all respects only as illustrative and not restrictive. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

What is claimed is:

1. A circuit comprising:
a signal source;
an output signal port;
a signal propagation channel between the signal source and the output signal port;
electromagnetic interference generation circuitry that is physically positioned within a proximity to the signal propagation channel on the circuit that enables electromagnetic interference generated by the electromagnetic interference generation circuitry to interact with the signal propagation channel to introduce jitter into an electronic signal generated by the signal source as propagates through the signal propagation channel to the output signal port; and
calibration circuitry configured to have a plurality of possible settings, each of at least some of the settings resulting in a different amount of the electromagnetic interference generated by the electromagnetic interference generation circuitry, in order to control the amount of jitter introduced into the electronic signal by the electromagnetic interference generation circuitry.

2. The circuit in accordance with claim 1, the signal source being an input signal port.

3. The circuit in accordance with claim 1, the electromagnetic interference circuit positioned at least at some portions more proximate to the signal propagation channel than design rules allow.

4. The circuit in accordance with claim 1, the calibration circuitry configured to hold a plurality of calibration settings for different amounts of jitter.

5. The circuit in accordance with claim 1, the calibration circuitry configured to hold a plurality of calibration settings for different amounts of jitter and different data rates.

6. The circuit in accordance with claim 1, the calibration circuit configured to respond to an instruction to introduce a particular amount of jitter by applying one of a plurality of calibration settings, the plurality of calibration settings for different amounts of jitter.

7. The circuit in accordance with claim 1, the calibration circuit configured to respond to an instruction to introduce a particular amount of jitter to a signal of a particular data rate by applying one of a plurality of calibration settings, the plurality of calibration settings for different amounts of jitter and different data rates.

8. The circuit in accordance with claim 1, the electromagnetic interference generation circuitry comprising a clock line.

9. The circuit in accordance with claim 8, the calibration circuit being configured to alter the characteristics of a clock signal applied to the clock line in response to the calibration settings.

10. The circuit in accordance with claim 1, the electromagnetic interference generation circuit comprising a plurality of networked switches.

11. The circuit in accordance with claim 10, the calibration circuit being configured to alter the configuration and timing of the switches in the plurality of networked switches in response to the calibration settings.

12. The circuit in accordance with claim 1, the electromagnetic interference generation circuit comprising a noisy path that is driven by a varying signal.

13. The circuit in accordance with claim 12, the calibration circuit being configured to alter the variances of the varying signal in response to the calibration settings.

14. The circuit in accordance with claim 1, the electromagnetic interference generation circuit comprising a noisy path that has designed anomalies.

15. The circuit in accordance with claim 14, the designed anomalies comprising a different length as compared to the signal propagation channel.

16. The circuit in accordance with claim 14, the designed anomalies resulting in a different characteristic impedance as compared to the signal propagation channel.

17. The circuit in accordance with claim 14, the signal being driven through the signal propagation channel and the noisy path.

18. A method for calibrating a circuit to introduce a particular amount of jitter to a signal using a particular calibration setting, the method comprising:
propagating a signal through a signal propagation channel that is proximate to electromagnetic interference generation circuitry, proximity between the signal propagation channel and the electromagnetic interference generation circuitry enabling electromagnetic interference generated by the electromagnetic interference generation circuitry to interact with the signal propagation channel to introduce jitter into the signal as propagates through the signal propagation channel;

varying one or more parameters of the electromagnetic interference generation circuitry until the particular amount of jitter is detected in the signal propagated through the signal propagation channel; and recording a set of values of the one or more parameters of the electromagnetic interference generation circuit that resulted in the particular jitter in the signal propagated through the signal propagation channel, the recording performed in a manner such that the calibration circuit may later be triggered to set the electromagnetic interference generation circuit to have the recorded set of values of the one or more parameters so as to achieve the particular jitter in the signal propagating through the signal propagation channel.

19. The method in accordance with claim 18, the particular amount of jitter being a first particular amount jitter, the set of values of the one or more parameters of the electromagnetic interference generation circuit being a first set of values of the one or more parameters, the method further comprising:

varying one or more parameters of the electromagnetic interference generation circuitry until a second particular amount of jitter is detected in the signal propagated through the signal propagation channel; and recording a second set of values of the one or more parameters of the electromagnetic interference generation circuit that resulted in the second particular jitter in the signal propagated through the signal propagation channel, the recording performed in a manner the calibration circuit may later be triggered to set the electromagnetic interference generation circuit to have the second set of recorded values of the one or more parameters so as to achieve the second particular jitter in the signal propagating through the signal propagation channel.

20. A method for applying a particular amount of jitter to a signal propagating through a signal propagation channel in a circuit, the method comprising:

causing a calibration circuit to set one or more values of one or more parameters of an electromagnetic interference generation circuit that emits electromagnetic interference, proximity between the signal propagation channel and the electromagnetic interference generation circuitry enabling the electromagnetic interference generated by the electromagnetic interference generation circuitry to interact with the signal propagation channel to apply the particular amount of jitter to the signal as it propagates through signal propagation channel, the set one or more values of the one or more parameters corresponding to the particular amount of jitter such that the particular amount of jitter is introduced into the signal propagating through the signal propagating channel.

* * * * *